United States Patent
Woodman, Jr.

(12)

(10) Patent No.: US 6,522,701 B1
(45) Date of Patent: Feb. 18, 2003

(54) METHOD AND APPARATUS FOR EXTRACTING RECEIVED DIGITAL DATA FROM A FULL-DUPLEX POINT-TO-POINT SIGNALING CHANNEL USING SAMPLED-DATA TECHNIQUES

(75) Inventor: Gilbert R. Woodman, Jr., San Jose, CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 09/168,311

(22) Filed: Oct. 7, 1998

(51) Int. Cl.[7] .................... H03K 9/00; H04L 27/06; H04L 27/14; H04L 27/22
(52) U.S. Cl. .................... 375/316; 327/603; 375/219
(58) Field of Search .................... 375/257, 256, 375/259, 316, 377, 219, 355; 327/9, 82; 326/83; 341/899

(56) References Cited

U.S. PATENT DOCUMENTS

| | | | |
|---|---|---|---|
| 4,162,371 A | 7/1979 | Belforte | 178/58 |
| RE30,111 E | 10/1979 | Blood, Jr. | 178/58 |
| 4,604,740 A | 8/1986 | Gandini et al. | 370/27 |
| 4,661,801 A | 4/1987 | Chen et al. | 340/347 |
| 4,698,800 A | 10/1987 | Cavaliere et al. | 370/24 |
| 5,216,667 A | 6/1993 | Chu et al. | 370/24 |
| 5,499,269 A | 3/1996 | Yoshino | 375/257 |
| 5,514,983 A | 5/1996 | Yoshino | 326/86 |
| 5,541,535 A | 7/1996 | Cao et al. | 326/83 |
| 5,568,064 A | 10/1996 | Beers et al. | 326/31 |
| 5,604,450 A | 2/1997 | Borkar et al. | 326/82 |
| 5,872,471 A | 2/1999 | Ishabashi et al. | 327/98 |
| 6,177,899 B1 * | 1/2001 | Hsu | 341/156 |
| 6,366,159 B1 * | 4/2002 | Taheri | 327/538 |

OTHER PUBLICATIONS

Haycock, Matthew and Mooney, Randy; "*A 2.5Gb/s Bidrectional Signaling Technology*", Hot Interconnects Symposium V, Aug. 1997, pp. 1–8.

Grebene, Alan B.; "*Bipolar and MOS Analog Integrated Circuit Design*", John Wiley & Sons, 1984, pp. 852–865.

Yee, Yen S., et al.; "*A 1 mV MOS Comparator*", IEEE J. Solid–State Circuits, vol. SC–13, pp. 294–298, Jun. 1978 (as reprinted in Analog MOS Integrated Circuits, IEEE Press, 1980, pp. 63–66).

Redfern, Thomas P., et al.; "*A Monolithic Charge–Balancing Successive Approximation A/D Technique*", IEEE J. Solid–State Circuits, vol. SC–14, pp. 912–920, Dec. 1979 (as reprinted in Analog MOS Integrated Circuits, IEEE Press, 1980, pp. 143–150).

Ishibashi, Kenichi et al.; "*SBTL (Simultaneous Bi–directional Transceiver Logic) for a 26.8 GB/s Crossbar Switch*", Hot Interconnects 6, Aug. 13–15, 1998, pp. 73–76.

* cited by examiner

*Primary Examiner*—Jean Corrielus
(74) *Attorney, Agent, or Firm*—Keith Kind; Kelly H. Hale

(57) ABSTRACT

A computer system couples multiple function units using channels having full-duplex, low power, point-to-point interconnect. Each function unit couples to the channel via a Channel Interface Block (CIB). The CIB includes a transmitter and a receiver. The receiver includes an integrating sampling capacitor, pass-gates having particular resistive characteristics, an auto-zero inverter, and a set of inverter stages for squaring the output of the inverter. These components are used to implement sampled-data methods and structures that perform received data extraction from the full-duplex channel signal.

18 Claims, 13 Drawing Sheets

METHOD AND APPARATUS FOR EXTRACTING RECEIVED DIGITAL DATA FROM A FULL-DUPLEX POINT-TO-POINT SIGNALING CHANNEL USING SAMPLED-DATA TECHNIQUES

FIELD OF INVENTION

The invention relates to point-to-point signaling, such as that optimally used to communicate data at high-speeds between adjacent function units in a digital system. More particularly, the invention relates to full-duplex point-to-point signaling.

BACKGROUND

The need for high-performance communication between chip components of computer elements continues to increase data transmission frequencies. The recent rise of clock forwarding techniques has enabled the signaling of multiple data bits per clock period. This means that edge rates may regularly be several times the clock rate. The increase in fast data edges has also increased reflected noise. Consequently, the signal transmission characteristics of chip, module, and connector signal paths have become more critical. Interconnect signaling circuits must support signal integrity at frequencies comparable to the edge rates for the data being communicated and in the presence of significant reflected noise. What is needed is a data receiver for full-duplex point-to-point data transmission that exhibits good signal integrity while operating over very reflective transmission lines and in an environment with large on-chip ground and power-supply noise.

Prior-art data receiver designs have required the use of expensive analog differential amplifiers having large numbers of components, large size, high power, and with stringent Common Mode design requirements. Thus what is further needed is a data receiver with a fewer components, smaller size, lower power, and is easier to implement than designs requiring differential amplifiers.

SUMMARY

A data receiver for full-duplex point-to-point data transmission is described includes an integrating sampling capacitor, pass-gates having particular resistive characteristics, an auto-zero inverter, and a set of inverter stages for squaring the output of the inverter. These components are used to implement sampled-data methods and structures that integrate the channel signaling voltage and perform received data extraction from the full-duplex channel signal. The sampled-data receiver exhibits good signal integrity while operating over very reflective transmission lines and in an environment with large on-chip ground and power-supply noise. The sampled-data receiver also uses fewer components, is smaller, has lower power, and is easier to implement than continuous-time prior-art designs that require analog differential amplifiers with stringent Common Mode signal requirements.

DETAILED DESCRIPTION

Figure 1:
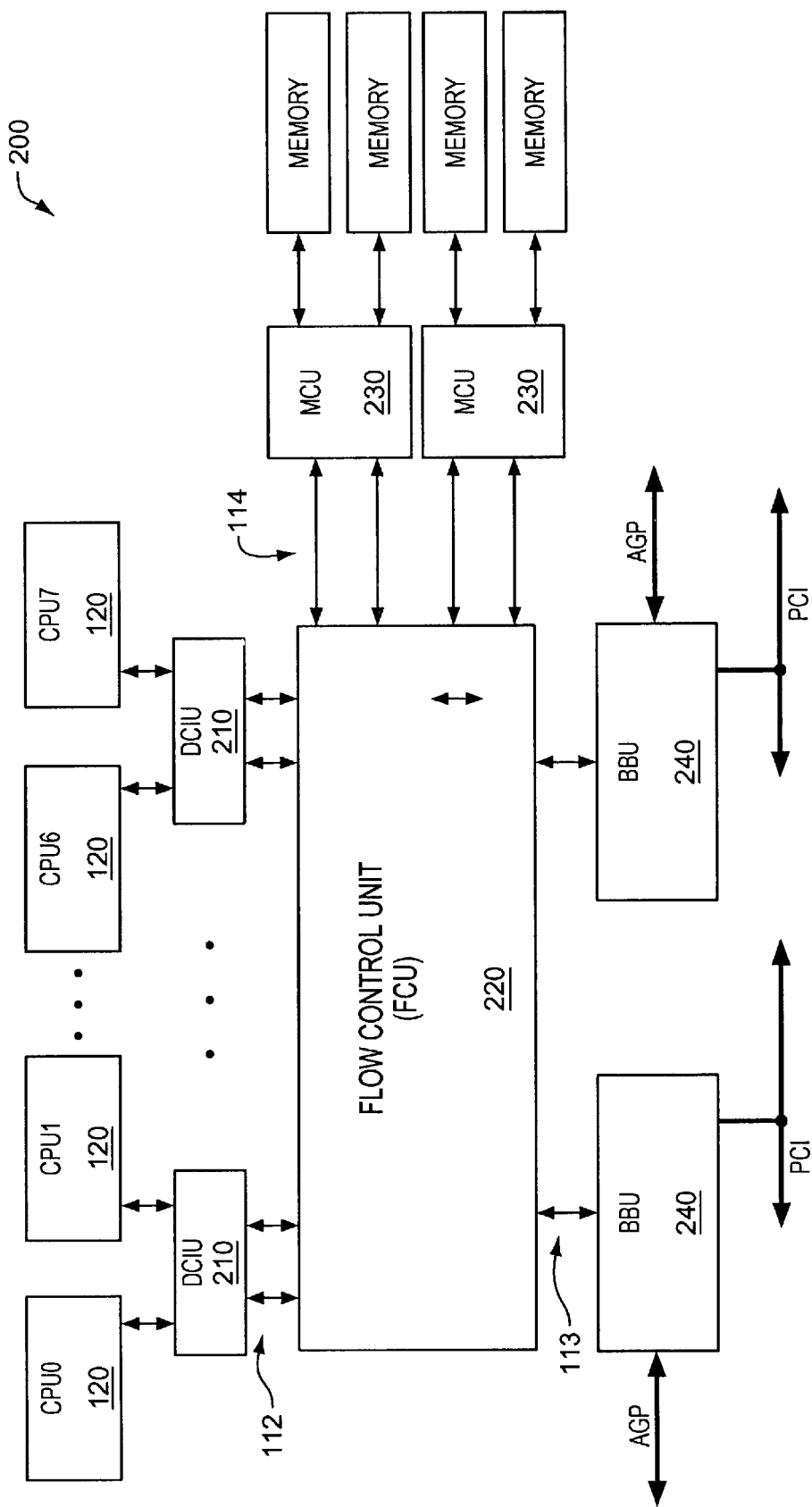
FIG. 1, is a drawing of a symmetric shared-memory multiprocessor system in which the present invention is used.

System Overview. FIG. 1 is a drawing of a symmetric shared-memory multiprocessor system 200 using a switched fabric data path architecture centered on a Flow-Control Unit (FCU) 220. In the illustrated embodiment, eight processors 120 are used and the configuration is referred herein as an "8P" system.

The FCU (Flow Control Unit) 220 chip is the central core of the 8P system. The FCU internally implements a switched-fabric data path architecture. Point-to-Point (PP) interconnect 112, 113, and 114 and an associated protocol define dedicated communication channels for all FCU I/O. The terms Channels and PP-Channel are references to the FCU's PP I/O. The FCU provides Point-to-Point Channel interfaces to up to ten Bus Bridge Units (BBUs) 240 and/or CPU Interface Units (CIUs) and one to four Memory Control Units (MCUs) 230. Two of the ten Channels are fixed to connect to BBUs. The other eight Channels can connect to either BBUs or CIUs. In an illustrative embodiment the number of CIUs is eight. The CIUs are preferably packaged as a pair referred herein as a Dual CPU Interface Unit (DCIU) 210. In the 8P system shown, the Dual CPU Interface Unit (DCIU) 210 interfaces two CPUs with the FCU. Thus, the DCIU 210 acts as a protocol converter between the CPU bus protocol and the PP-Channel protocol. Throughout this description, a reference to a "CIU" is understood to describe the logical operation of each half of a DCIU 210 and a references to "CIUs" is understood to apply to an implementation that uses DCIUs 210.

The FCU 210 provides a high-bandwidth and low-latency connection among these components via a Data Switch, also referred herein as a Simultaneous Switched Matrix (SSM), or switched fabric data path. In addition to connecting all of these components, the FCU provides the cache coherency support for the connected BBUs and CIUs via a Transaction Controller and a set of cache-tags duplicating those of the attached CPUs' L2 caches. U.S. application Ser. No. 08/986, 430, AN APPARATUS AND METHOD FOR A CACHE COHERENT SHARED MEMORY MULTIPROCESSING SYSTEM, filed Dec. 7, 1997, now U.S. Pat. No. 6,065,077 is hereby incorporated by reference, and provides additional detail of the overall operation of the system of FIG. 1.

Channel Overview. The preferred embodiment permits the multiple function units of the computer system of FIG. I to be coupled using channels that use full-duplex, low power, point-to-point interconnect. This reduces packaging requirements for large I/O interconnects by permitting simultaneous bi-directional signaling over a single-pin. The preferred embodiment supports high speed, synchronous, computer-bus-like digital data channels for backplanes and cards. Each channel has 16 data lines, two parity lines, four control lines, and one clock line. The channels provide a signal rate of 800 Mbits per second over channel lengths up to 12-inches.

The full-duplex point-to-point interconnect of the preferred embodiment presumes matched impedance drivers. This describes a situation where the output impedance of the drivers at each end of the net matches the characteristic impedance of the net. Thus, the quiescent net has three possible voltage levels, depending on the driver state at each end of the net. If both drivers are sending a "0", the net is at a low level. If one driver is sending a "0" and the other is sending a "1", the net is at the mid point in its possible voltage range. If both drivers are sending a "1", the net is at the high level of its possible voltage range.

Data is thus encoded into three voltage states as a function of the two driver signals. A suitable reference for extracting the data from the net has the two values of one quarter of the voltage swing for a local driver sending a "0", and three quarters of the voltage swing for a local driver sending a "1".

Parallel transfer of data, at a rate that can not be captured synchronously by the receiving chip with a clock present on the chip, can be captured by using a clock that is sent with the data, on a separate net. This strategy has been named "clock forwarding". There is no conceptual limit to the number of data bits per data net, that can be sent for each period of the clock forwarding signal. In the preferred embodiment the channel sends four data bits for each period of the clock signal. The data extraction function is to format a suitable sampling signal from the clock signal, in order to capture the data off the data net as it arrives in a serial stream.

Figure 2A:
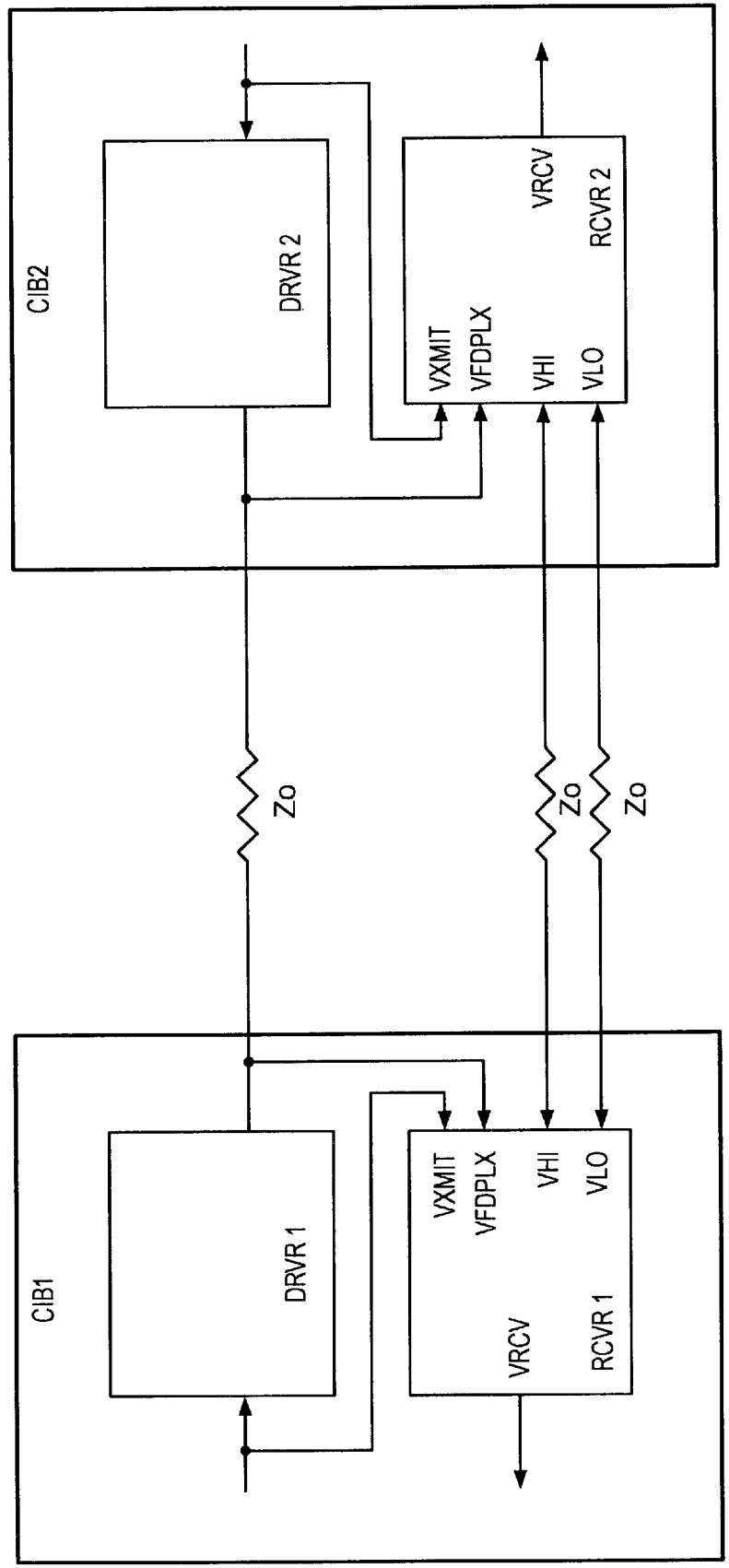
FIG. 2A illustrates two Channel Interface Block (CIBs) communicating over a channel, as is known in the art. Each CIB includes a transmitter and a receiver.
Figure 2B:
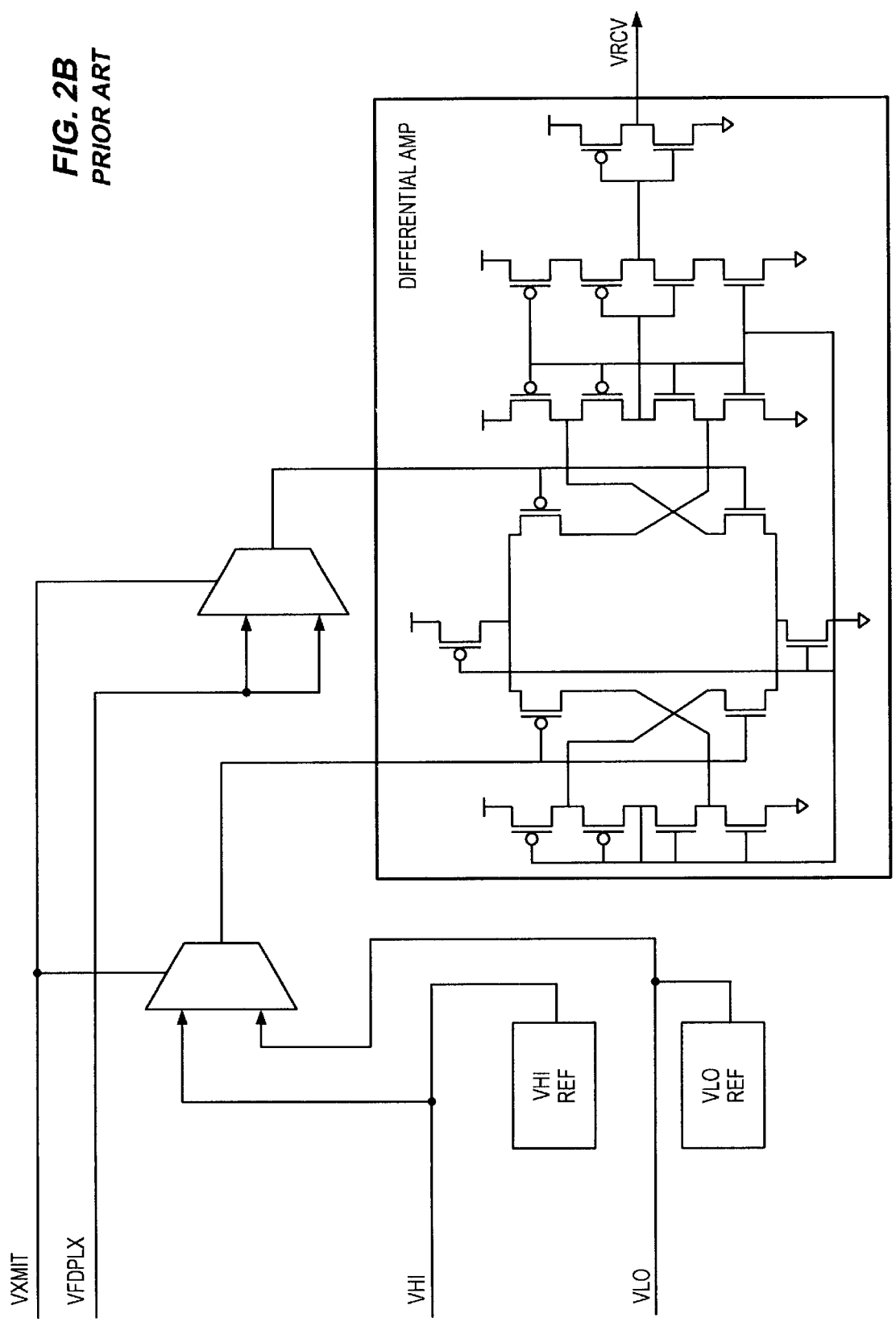
FIG. 2B illustrates a prior-art design of a receiver for a CIB.

Channel Interface Overview. Each function unit couples to the channel via a Channel Interface Block (CIB). The CIB includes a transmitter and a receiver. FIG. 2A illustrates two CIBs communicating over a channel, as is known in the art. The present invention concerns the design of the receiver portion of the CIBs. FIG. 2B illustrates a prior-art receiver design. U.S. Pat.No. 5,604,450, HIGH SPEED BIDIRECTIONAL SIGNALING SCHEME, Borkar et al., describes the operation of channel interfaces operating in accordance with FIGS. 2A and 2B, and is hereby incorporated by reference.

Figure 3A:
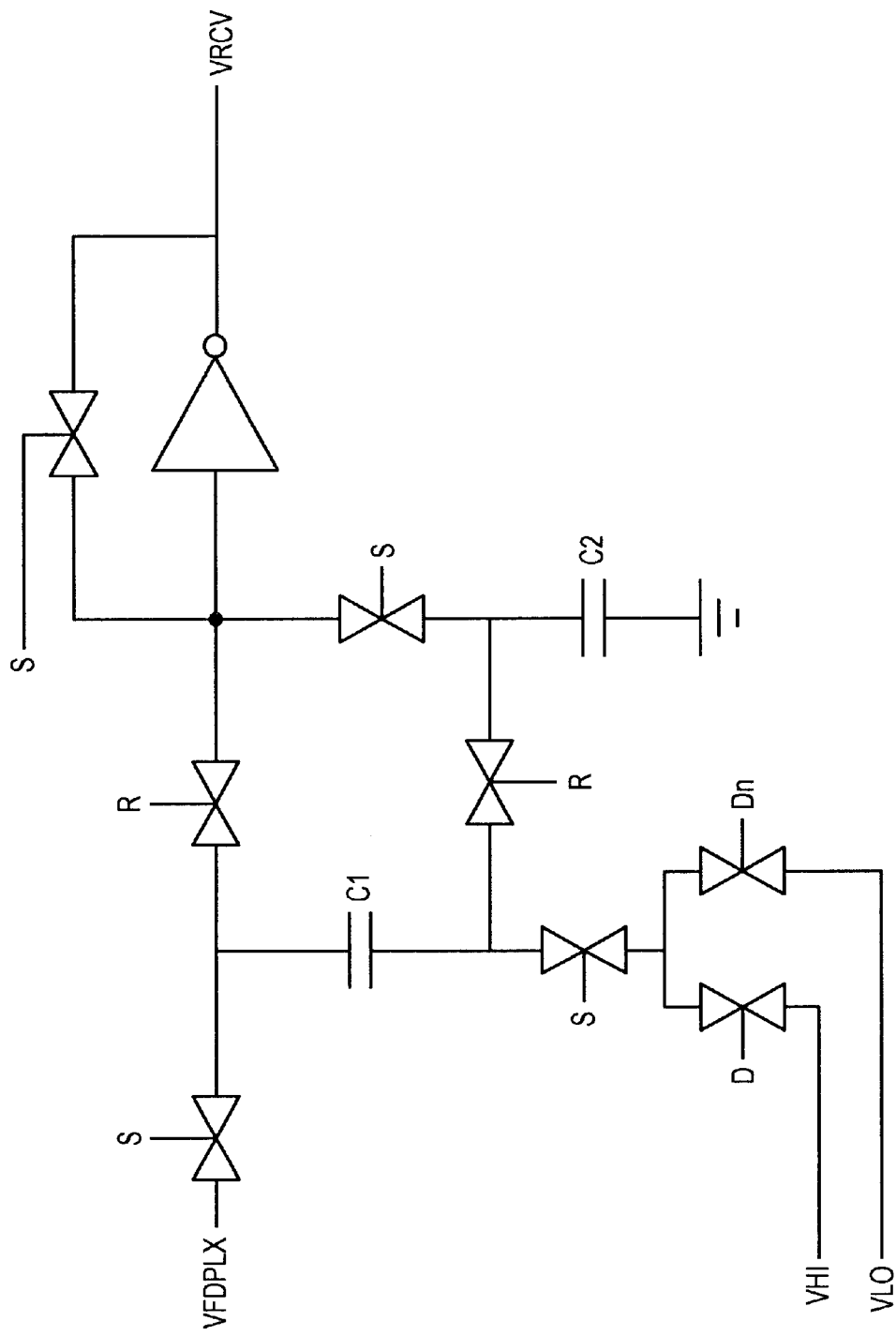
FIG. 3A illustrates the receiver design of the present invention.
Figure 3B:
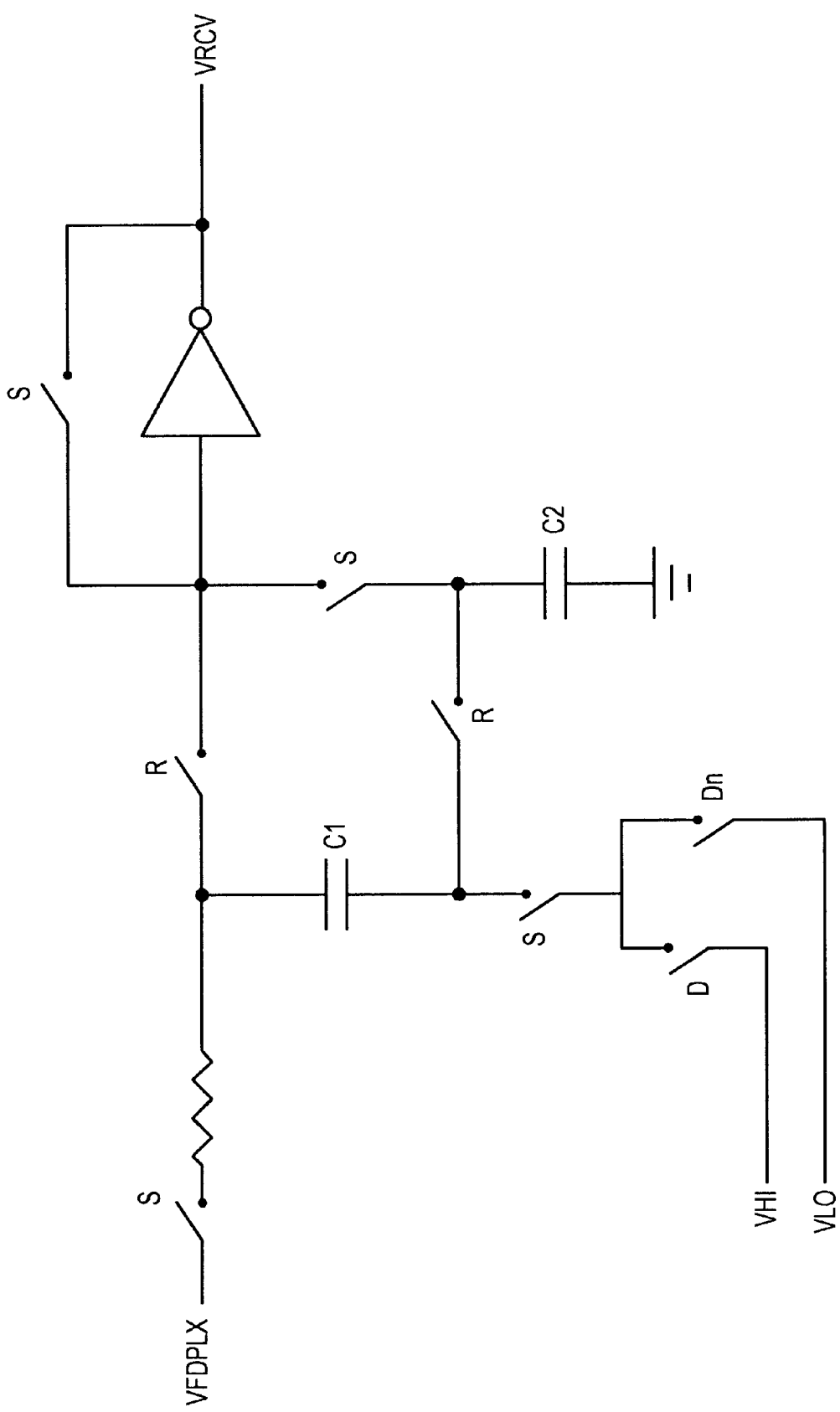
FIG. 3B shows an abstract representation of the receiver, replacing the pass-gates of FIG. 3A with switches and significant resistances, if any.
Figure 3D:
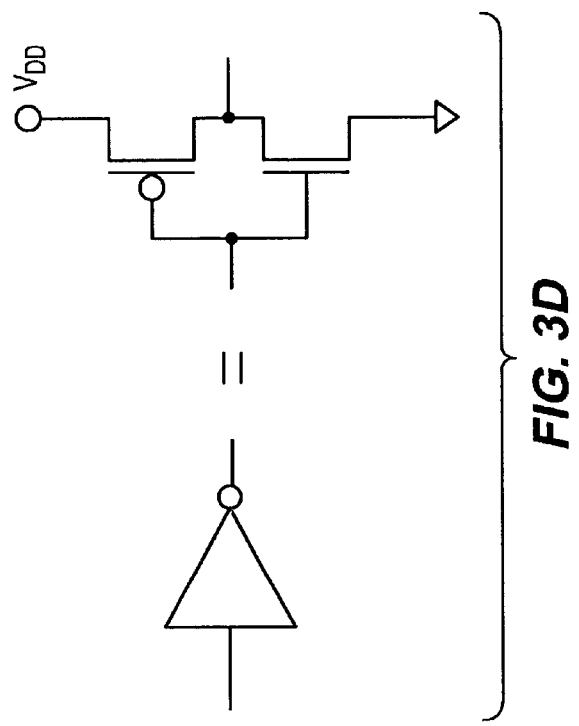
FIGS. 3C and 3D suggest the underlying device structures used to implement the pass-gates and inverter of FIG. 3A.
Figure 3C:
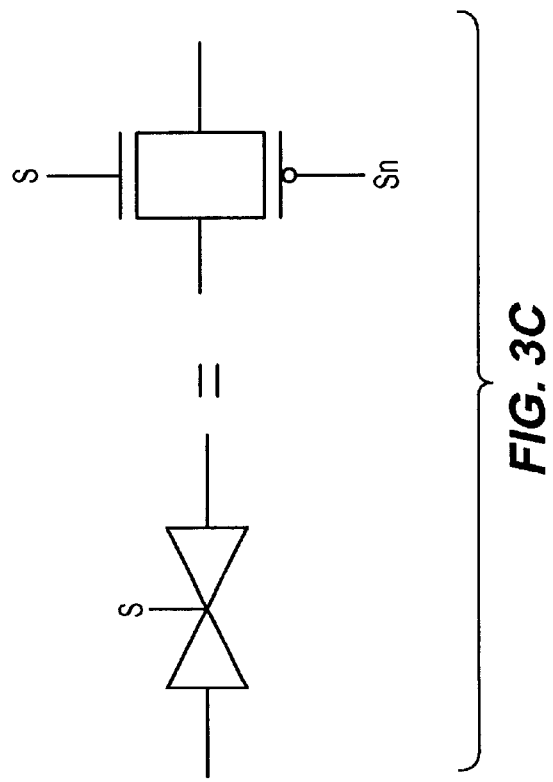

The receiver of the present invention is shown in FIG. 3A though 3D. The receiver of FIGS. 3A–3D includes an integrating sampling capacitor, pass-gates having particular resistive characteristics, an auto-zero inverter, and a set of inverter stages for squaring the output of the inverter. These components are used to implement sampled-data methods and structures that perform received data extraction from the full-duplex signal. The present invention is believed to be patentably distinct over similar sampled-data methods and structures previously used in the non-analogous art of flash Analog-to-Digital Converters (ADCs).

In the full-duplex signaling protocol used by the illustrated embodiments, the receiver extracts receive data from the channel signal by evaluating the channel signal voltage with reference to one of two or more signal thresholds. Selection of the signal threshold is dependent on the state of the local data driver, and is totally independent of the incoming signal. The timing of a sampling window is generated from a clock sent in synchronism with the data.

Receiver Overview. The desired function of the receiver is to evaluate the information on the net during the time data is expected to be present, rejecting interference from all noise sources. The receiver integrates in a simple RC fashion the channel signaling voltage in order to filter reflections and other noise. A sample is taken of the signaling voltage referenced to the selected voltage reference, which is selected based on the transmit state of the receiver's companion transmitter. The sample is then input to an inverter that was previously dynamically biased at its high gain operating point by shorting the inverter's output to its input during the data sampling period.

Detailed Receiver Operation. The "Bow Tie" symbols represent CMOS "pass-gates", that is pairs of CMOS P and N transistors connected in parallel. They function as electrical switches, and thus couple circuit nodes when the control signal enables them. Since they are made up of physical devices, they exhibit intended and incidental (parasitic) resistance and capacitance.

The letters "S, R, D, and Dn" represent control signal names for the pass gates. When the corresponding signal is asserted, the pass gate would couple the two nodes, through the resistance inherent in the pass-gate's associated width and length.

The pass gate connecting the full-duplex channel signal to the top of capacitor C1 is sized to exhibit the resistance for the desired integration RC time constant. During the sampling period of signal S, Data Net is connected to the top of capacitor C1, and the bottom of C1 is connected to the reference selected by the state of the local output driver (VHi or VLo). The pass-gates for the bottom of C1 are sized to minimize their effective DC resistance, to minimize the voltage drop incurred across these gates, which would otherwise contribute a voltage sampling error that could diminish noise performance.

During the sampling period S, the output is shorted to the input of the inverter, and the inverter input is connected to the top of capacitor C2. This will cause the inverter to approach its DC operating point, so that it is in a high current, high gain state. The DC operating point is then stored on capacitor C2. The device sizes of the inverter are selected to achieve the balance of acceptable current and acceptable time response, normally a small width and long channel length device pair. The pass gate devices are sized to minimize the DC resistance and exhibit an acceptable parasitic load to the inverter.

At the end of the sample period, there will be a short gap of time while the pass gates are allowed to fully open, disconnecting the attached nodes. The receiver will then be caused to resolve the voltage value stored on capacitor C1 by translating C1 between the top of C2 and the input node of the inverter. This will cause the voltage at the input of the inverter to move from the DC operating point to the arithmetic sum of the voltage on C2 and C1. The inverter is at a high gain operating point, so that its output will translate to a new value representing the gain times the difference imposed on its input. The receiver circuit is completed by adding one or more squaring amplifiers, normally as inverters, and possibly a logic gate to disable assertion of the output to downstream logic.

There is no phasing requirement for the relationship between the receive data and the data being transmitted on the same net, so that the reference selection is controlled only by the outgoing data. In the preferred embodiment a reference selection will occur during the sampling period.

The voltage captured on capacitor C1 during the sample period can be either positive or negative so that it should be implemented as a small metal capacitor, possibly in the range of 5OfF. The capacitor C2 can be implemented as an N device gate capacitor.

Figure 4:
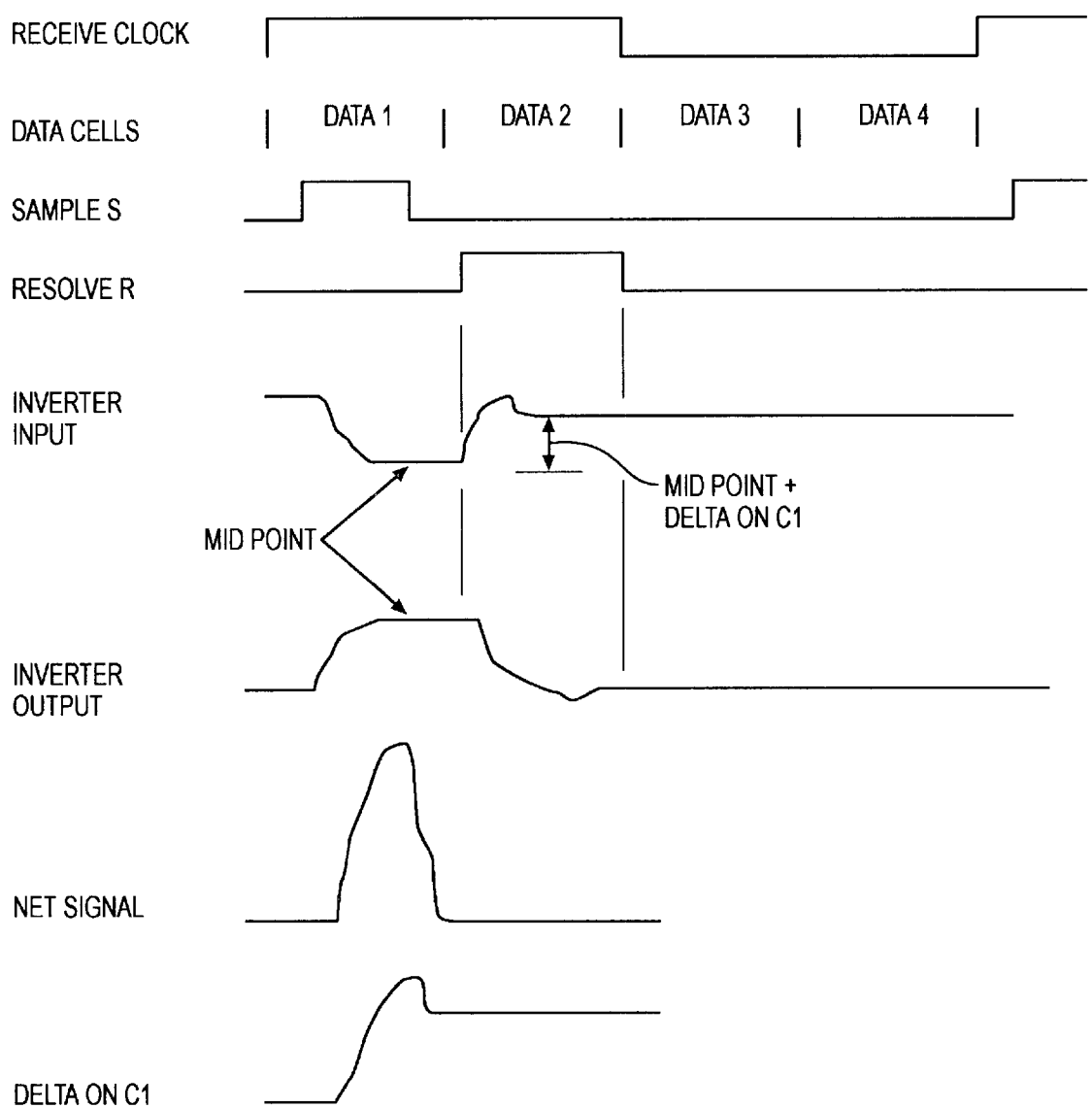
FIG. 4 is a timing diagram illustrating the operation of the receiver of FIG. 3A.

FIG. 4 is a timing diagram illustrating the operation of the receiver of FIG. 3A.

Figure 5:
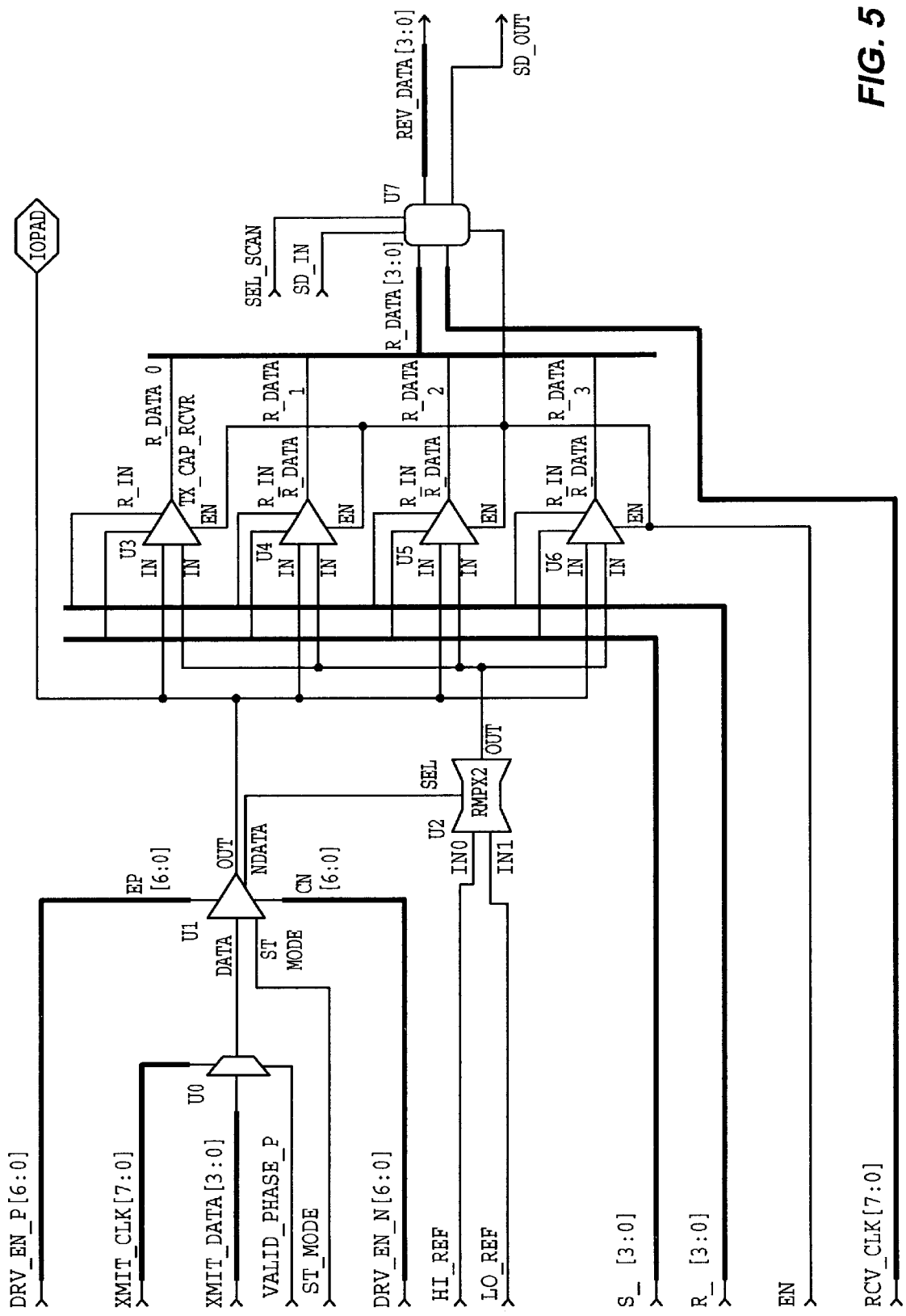
FIG. 5 is a schematic of an implementation of the CIB.

FIG. 5 is a schematic of an implementation of the CIB.

Figure 6:
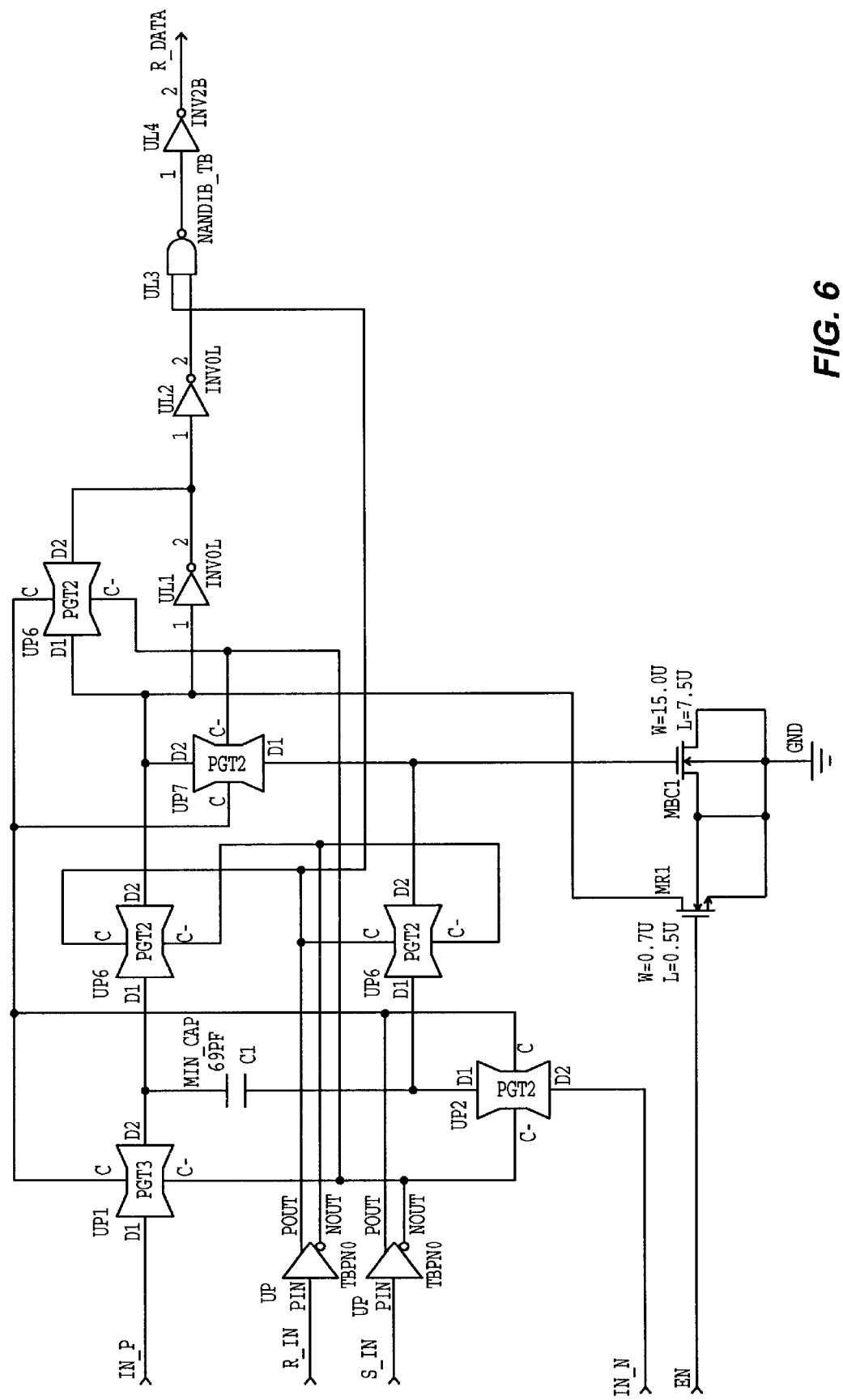
FIG. 6 is a schematic of an implementation of the CIB's receiver.

FIG. 6 is a schematic of an implementation of the CIB's receiver.

Figure 7:
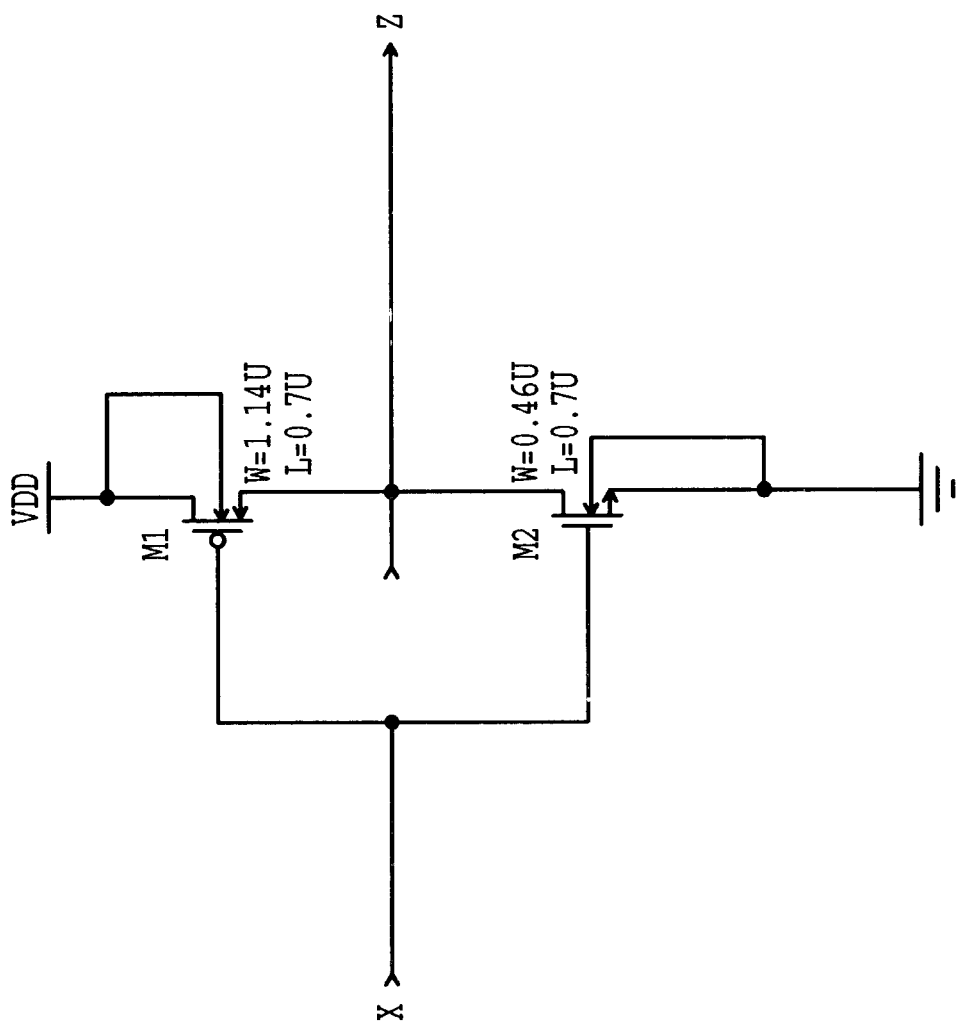
FIG. 7 is a schematic of the principal inverter used in the receiver.

FIG. 7 is a schematic of the principal inverter used in the receiver.

Figure 8:
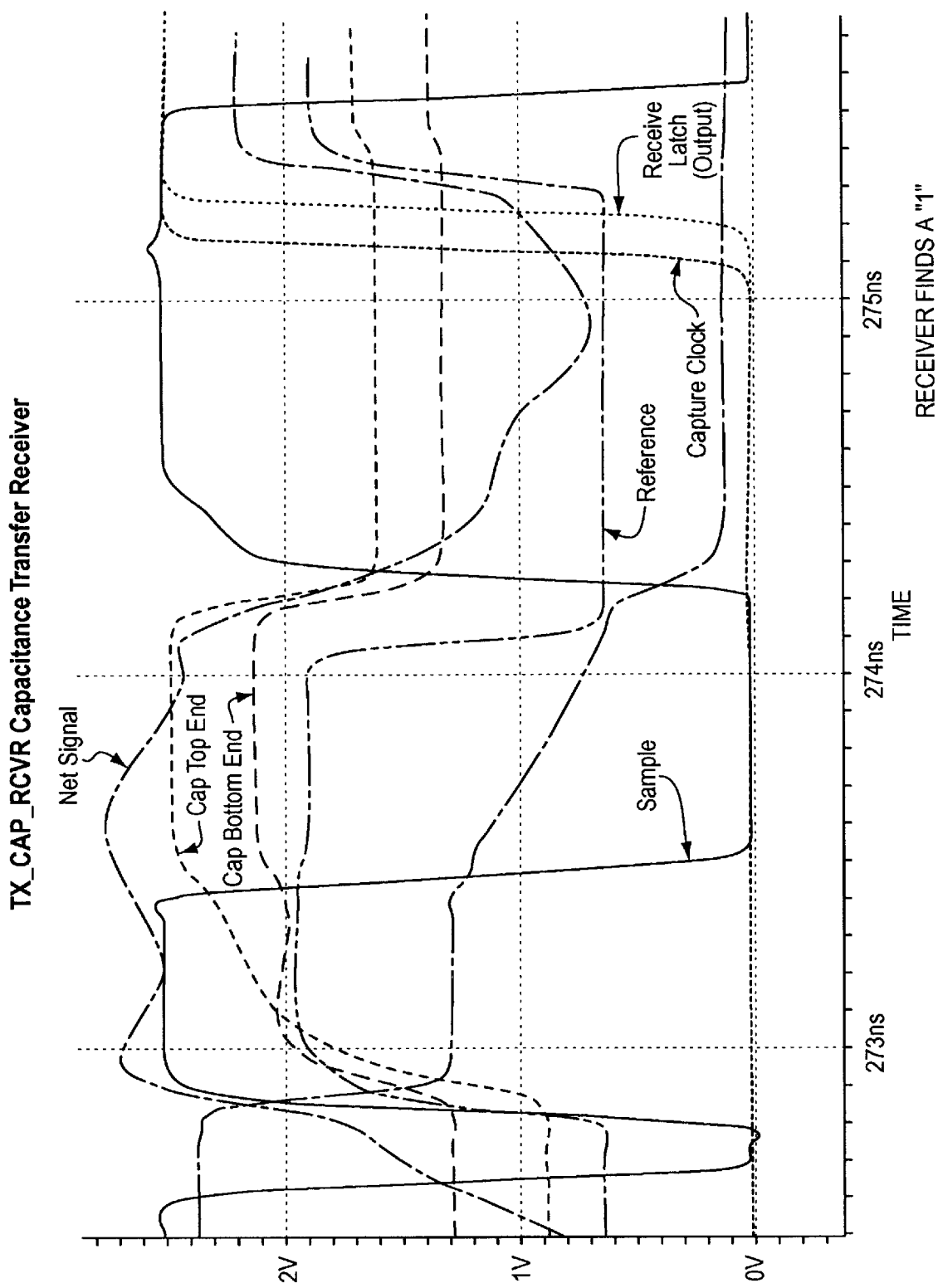
FIG. 8 show simulated waveforms for the receiver of FIG. 7 for the case of the receiver finding a "1" on the signaling channel (the Net Signal).

FIG. 8 shows simulated waveforms for the receiver of FIG. 7 for the case of the receiver finding a "1" on the signaling channel (the Net Signal).

Figure 9:
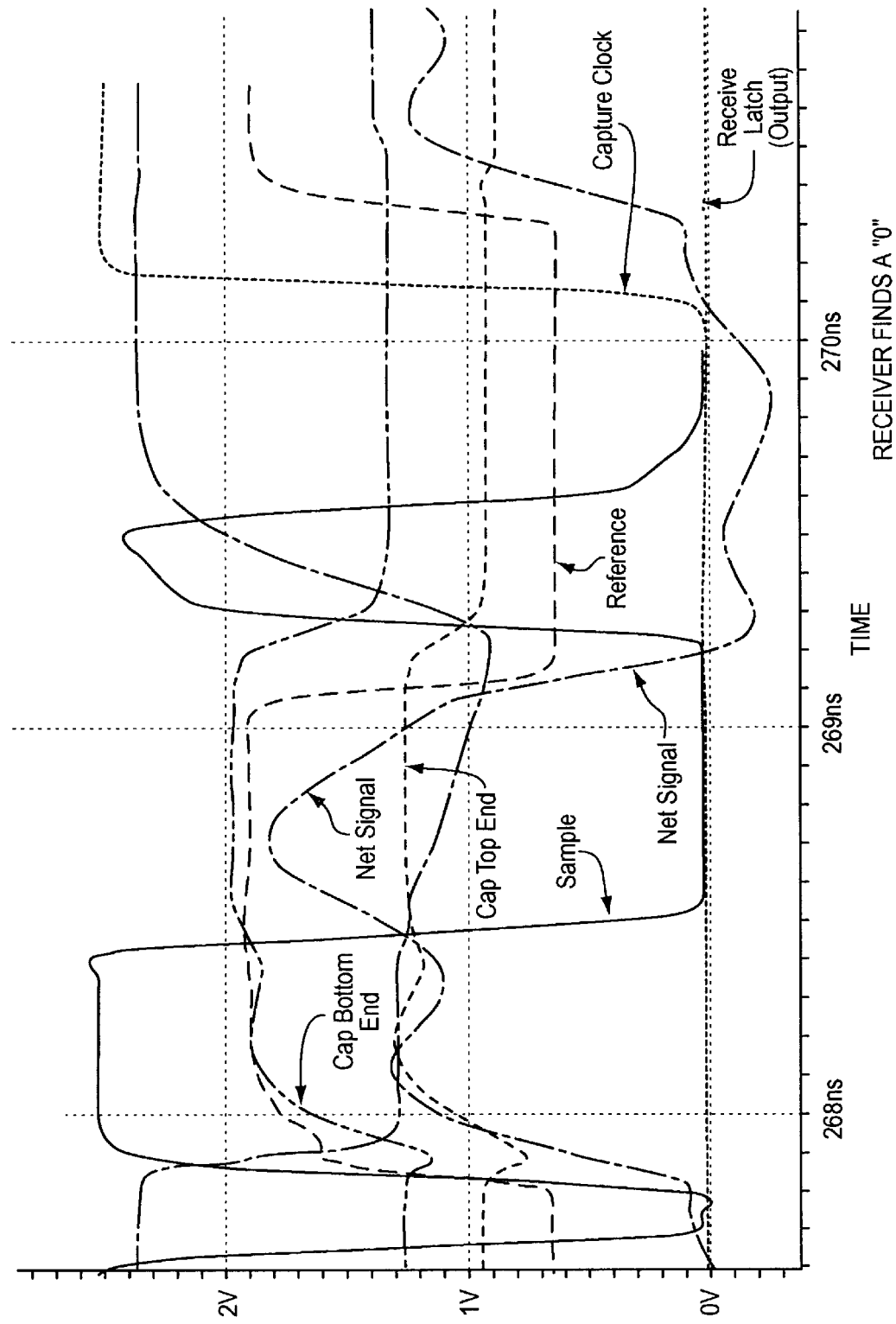
FIG. 9 show simulated waveforms for the receiver of FIG. 7 for the case of the receiver finding a "0" on the signaling channel (the Net Signal), when the receive latch previously held a "0."

FIG. 9 shows simulated waveforms for the receiver of FIG. 7 for the case of the receiver finding a "0" on the signaling channel (the Net Signal), when the receive latch previously held a "0."

Figure 10:
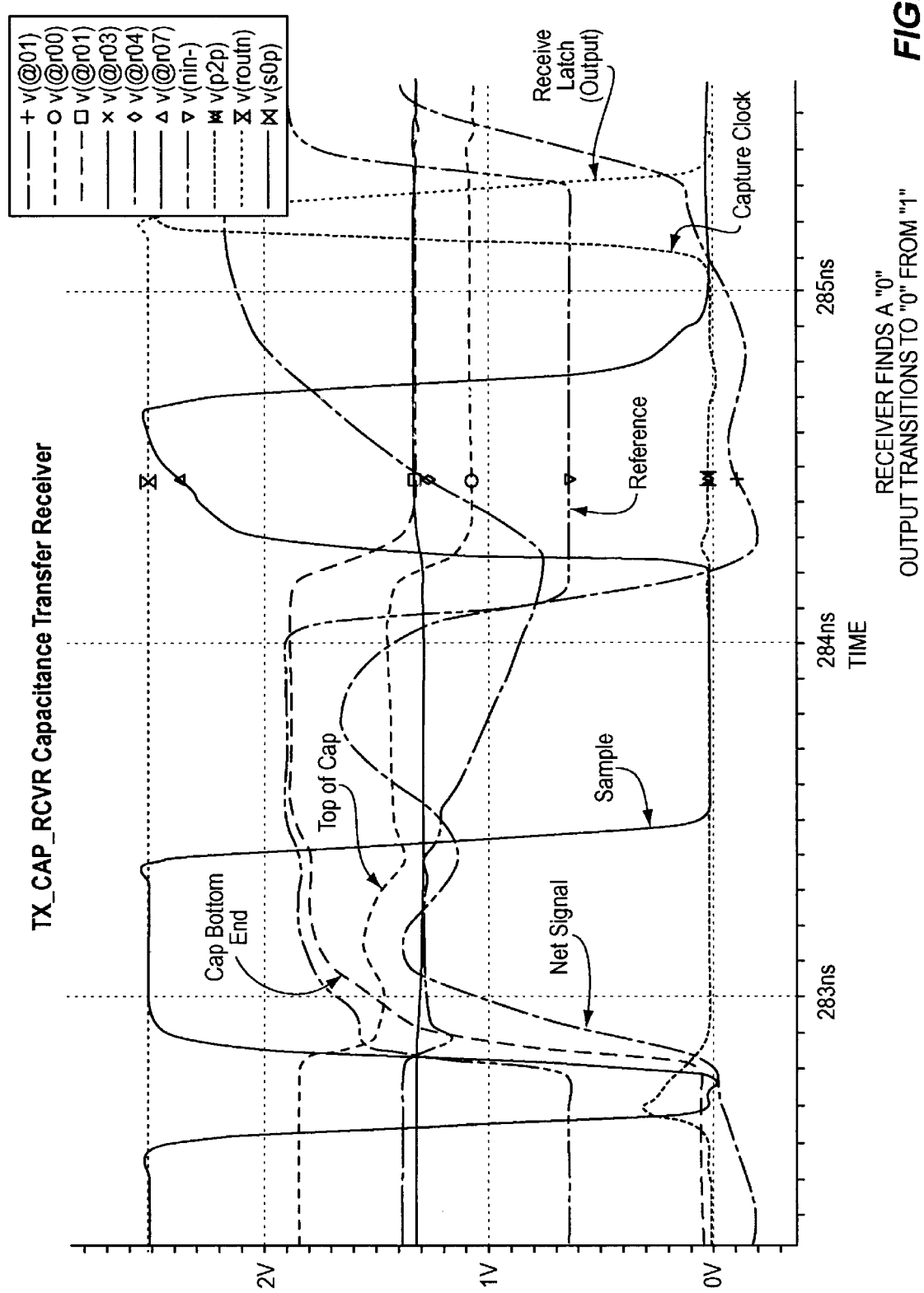
FIG. 10, show simulated waveforms for the receiver of FIG. 7 for the case of the receiver finding a "0" on the signaling channel (the Net Signal), when the receive latch previously held a "1".

FIG. 10 shows simulated waveforms for the receiver of FIG. 7 for the case of the receiver finding a "0" on the signaling channel (the Net Signal), when the receive latch previously held a "0."

Conclusion

Although the present invention has been described using particular illustrative embodiments, it will be understood that many variations in construction, arrangement and use are possible within the scope of the invention. For example, the number of bits transmitted per clock period, the specific types of pass-gates and their clocking, the manner in which the resistance of the RC time constant is implemented, or the choice of technology used to implement the capacitors, may all be varied. Functionally equivalent techniques known to those skilled in the art may be employed instead of those illustrated to implement various components. The names given to interconnect and logic are illustrative, and should not be construed as limiting the invention. The present invention is thus to be construed as including all possible modifications and variations encompassed within the scope of the appended claims.

What is claimed is:

1. In a channel interface for a system using a full-duplex point-to-point signaling channel, a method of extracting received digital data, the method comprising:
a) providing a sampling capacitor having a first node and a second node;
b) providing a plurality of voltage references;
c) providing an inverter having an input and an output;
d) providing transmitted digital data being sent by the channel interface;
e) selecting one of said plurality of voltage references in accordance with the transmitted digital data of the channel interface;
f) during a sampling interval,
i) coupling said signaling channel to the first node of the sampling capacitor; and
ii) coupling the selected voltage reference to the second node of the sampling capacitor; and
g) during an evaluation interval,
i) coupling said sampling capacitor to the input of the inverter; and
ii) generating the received digital data for the channel interface at the output of the inverter.

2. The method of claim 1, wherein said coupling of said signaling channel to the first node of the sampling capacitor includes a resistance chosen in conjunction with the sampling capacitor to create a desired integration time constant.

3. The method of claim 2, wherein said coupling of said signaling channel to the first node of the sampling capacitor is performed by at least one pass-gate transistor and said resistance is a pass-gate transistor parasitic resistance determined in part by the pass-gate transistor size.

4. A method of extracting received digital data from a full-duplex point-to-point signaling channel, comprising the steps of:
(a) providing a first capacitor having a first node and a second node;
(b) providing a plurality of voltage references;
(c) providing an inverter having an input and an output;
(d) sending transmitted digital data via the signaling channel;
(e) selecting one of said plurality of voltage references in accordance with said transmitted digital data;
(f) during a sampling interval,
(i) coupling said signaling channel to the first node of the sampling capacitor, and
(ii) coupling the selected voltage reference to the second node of the sampling capacitor; and
(g) during an evaluation interval,
(i) coupling said sampling capacitor to the input of the inverter, and
(ii) generating the received digital data for the channel interface at the output of the inverter.

5. The method of claim 4, further comprising the steps of:
providing a second capacitor having a third node and a fourth node; coupling said fourth node to a ground connection; coupling said inverter's input to said third node during said sampling interval; and
coupling said second node to said third node during said evaluation interval.

6. The method of claim 4, further comprising the step of pausing for a first time gap between said sampling interval and said evaluation interval.

7. The method of claim 6, wherein said first time gap comprises an amount of time to allow said signaling channel and the first node to decouple, and to allow the selected voltage reference and the second node to decouple.

8. The method of claim 4, further comprising the step of disabling assertion of the output to downstream logic.

9. A transceiver for extracting digital data received from a full-duplex point-to-point signaling channel, comprising:
an output driver, coupled to the signaling channel, having a plurality of output states;.
a first capacitor having a first node and a second node;
a plurality of voltage references;
an inverter having an input and an output;
a first switch coupling the signaling channel to said first node;
a second switch coupling a selected one of said voltage references to said second node, wherein said first and second switches are closed during a sampling interval, and said selected voltage reference is chosen in accordance with said output states; and a third switch coupling said first node to said input, wherein said third switch is closed during an evaluation interval and the digital data is extracted at said output.

10. The transceiver of claim 9, wherein said the capacitance of said first capacitor is selected to match the impedance of the signaling channel.

11. The transceiver of claim 9, further comprising:

a second capacitor having a third node and a fourth node, wherein said fourth node is coupled to a ground connection;

a fourth switch coupling said input to said third node, wherein said fourth switch is closed during said sampling interval and open during said evaluation interval; and a fifth switch coupling said second node to said third node, wherein said fifth switch is open during said sampling interval and closed during said evaluation interval.

12. The transceiver of claim 11, wherein said first, second, third, fourth, and fifth switches each comprise a CMOS pass-gate.

13. The transceiver of claim 11, wherein said sampling interval and said evaluation interval are separated in time by a first time gap.

14. The transceiver of claim 13, wherein said first time gap comprises an amount of time to allow said first and second switches to fully open.

15. The transceiver of claim 13, further comprising a squaring amplifier coupled to said output.

16. The transceiver of claim 15, wherein said second amplifier comprises an invrter.

17. The transceiver of claim 9, further comprising a logic gate coupled to said output.

18. The transceiver of claim 9, wherein said second capacitor comprises an N device gate capacitor.

* * * * *